(12) United States Patent
Watanabe et al.

(10) Patent No.: US 6,241,340 B1
(45) Date of Patent: Jun. 5, 2001

(54) INK-JET RECORDING HEAD, PROCESS FOR PRODUCING THE HEAD AND INK-JET RECORDING APPARATUS EMPLOYING THE HEAD

(75) Inventors: Yasutomo Watanabe, Hiratsuka; Riichi Saito, Fujisawa, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/902,324

(22) Filed: Jul. 29, 1997

(30) Foreign Application Priority Data

Jul. 31, 1996 (JP) .................................................. 8-202248

(51) Int. Cl.$^7$ ....................................................... B41J 2/14
(52) U.S. Cl. .................................................................. 347/50
(58) Field of Search ................................. 347/50; 439/67, 439/493

(56) References Cited

U.S. PATENT DOCUMENTS

| | | | |
|---|---|---|---|
| 5,360,943 | * 11/1994 | Mori et al. | 439/67 |
| 5,422,667 | * 6/1995 | Daggs et al. | 347/50 |
| 5,459,500 | * 10/1995 | Morris et al. | 347/50 |

FOREIGN PATENT DOCUMENTS

| | | |
|---|---|---|
| 0 593 175 | 4/1994 | (EP) . |
| 0 646 463 | 4/1995 | (EP) . |
| 5-166998 | 7/1993 | (JP) . |

* cited by examiner

Primary Examiner—Richard Moses
Assistant Examiner—Hoang Ngo
(74) Attorney, Agent, or Firm—Fitzpatrick, Cella, Harper & Scinto

(57) ABSTRACT

By the present invention, there is provided an ink-jet recording head comprising at least one recording device substrate for discharging a recording liquid by pressure of bubble formation caused by thermal energy, a flexible film wiring substrate for fitting the recording device substrate thereto, an electrode pad for receiving control signals from outside for controlling thermal energy generation in the recording device substrate, and a wiring substrate connected electrically to the recording device substrate with interposition of the flexible film wiring substrate, wherein an input terminal of the flexible film wiring substrate and an output terminal of the wiring substrate are electrically connected to each other and fixed by a thermosetting adhesive by hot-pressing, and the connected electrode portion is coated with the thermosetting adhesive.

37 Claims, 10 Drawing Sheets

INK-JET RECORDING HEAD, PROCESS FOR PRODUCING THE HEAD AND INK-JET RECORDING APPARATUS EMPLOYING THE HEAD

BACKGROUND OF THE INVENTION

1. Field of the Invention

The present invention relates to a recording head of an ink-jet recording apparatus for OA machines or the like. Particularly, the present invention relates to an ink-jet recording head comprising a recording device substrate for discharging a recording liquid fitted to a flexible film wiring substrate. The present invention relates also to an ink-jet recording apparatus employing the ink-jet recording head.

2. Related Background Art

The ink-jet recording apparatus, which conducts recording by a non-impact recording system, has advantages of high speed recording, suitability for various recording mediums, and less recording noise generation. Therefore, the ink-jet recording is employed widely in recording mechanisms of various machines such as printers, word processors, and copying machines.

The ink-jet recording conducts recording by discharging fine liquid droplets through a discharge opening onto a recording medium like a paper sheet, typically employing an electrothermal converting element. The ink-jet recording apparatus is constituted generally of an ink-jet recording head having a nozzle for forming liquid droplets and an ink-supplying system for supplying the ink to the head. In the ink-jet recording head employing an electrothermal converting element, the electrothermal converting element is provided in a pressurizing chamber. An electric pulse as the recording signal is applied to the electrothermal converting element to give thermal energy to the recording liquid. The phase change of the recording liquid due to thermal energy causes bubbling (or boiling) of the recording liquid, and the pressure of the bubbles forces the recording liquid to eject.

The ink-jet recording heads employing the electrothermal converting system are classified into two types: an edge shooter type which discharges the recording liquid in the direction parallel to the substrate having electrothermal converting elements arranged thereon, and a side shooter type which discharges the recording liquid in the direction perpendicular to the substrate. The constitution of the ink-jet recording head is described specifically by reference to the side shooter type recording head.

FIG. 10 is a perspective view of a side shooter type recording head.

Plural discharge openings 202 are formed for discharging ink at the central portion on the front side of a recording device substrate 201. On the reverse side of the substrate, an ink-supplying opening 203 (broken line in the drawing) is formed in a length nearly equal to the length of the row of the discharge openings. Although several discharge openings are shown in FIG. 10, several tens or several hundreds of discharge openings are provided in a practical recording device substrate.

For ink discharge, electrodes on the recording device substrate 201 are electrically connected to electrode terminals of a flexible film wiring substrate 204. The input terminals of the flexible film wiring substrate 204 are electrically connected to output terminals of a wiring substrate 206 having external input pads 205 for supplying electric signals of recording information and the like to an ink-jet recording head from an ink-jet recording apparatus body. The numeral 212 indicates an ink supplying-holding member.

FIG. 11 shows specifically a structure of the recording device substrate and the flexible film wiring substrate. FIG. 12A and FIG. 12B show the state of the recording device substrate fitted to the flexible film wiring substrate: FIG. 12A is a perspective view showing the state, and FIG. 12B is a sectional view taken along the plane 12B in FIG. 12A.

In FIG. 11, electrodes 210 are formed on a recording device substrate 201 for connection with output terminals of a flexible film wiring substrate 204. The electrodes 210 are usually formed in rows on the end portion of the surface of the recording device substrate 201. The electrode formation can be conducted by a conventional technique such as plating by patterning, and ball-electrode formation by wire bonding (stud bump).

The flexible film wiring substrate 204 has an aperture which uncovers the orifice face 207 having discharge orifices 202 when the recording device substrate 201 is fitted thereto. In this aperture, electrode terminals 208 are provided for connection with the electrodes 210 on the recording device substrate 201. The electrode terminals 208 of the flexible film wiring substrate 204 are connected with the electrodes 210 of the recording device substrate 201 by ILB (inner lead bonding) of the terminals of TAB (tape automated bonding).

The recording device substrate 201 is fitted to the flexible film wiring substrate 204 as shown FIGS. 12A and 12B such that the electrodes 210 of the recording device substrate 201 are connected to the electrode terminals 208 of the flexible film wiring substrate 204 and the orifice face 207 is fitted to the aperture of the flexible film wiring substrate 204. To prevent corrosion of the electrodes and underlying metallic materials thereof by deposition of splashed liquid droplets from the discharge opening or by repelled ink from a recording medium, the electrode portions are coated and sealed with a sealing material 211 such as an epoxy resin which has sufficient sealing and ion-intercepting properties. In this structure, the recording liquid is supplied from an ink supply opening 203 to an ink flow path 209 communicating with ink discharge openings 202, and liquid droplets are discharged through the discharge openings 202.

In recent years, with the progress of ink-jet recording head in high speed recording and multi-color recording, an ink supplying-holding member (212 in FIG. 10) has come to be employed which holds plural flexible film wiring substrates 204 holding plural recording device substrates. In such a case, as shown in FIG. 13, the input terminals 204' of the flexible film wiring substrate 204 are connected to the output terminals 206' of the wiring substrate 206 by solder 213, and a flux is used as an active agent for removal of an oxide film and stains.

The above-mentioned ink-jet recording head has problems of low printing quality and low reliability as described below.

(1) The flexible film wiring substrate is connected with the wiring substrate by use of solder, and an oxide film or a stain is removed by a flux. It causes splashing of flux during the soldering to cause clogging of the discharge opening of the recording device substrate to lower the print quality.

(2) A flux residue 211 as shown in FIG. 13 after the soldering generates an ionic gas. The gas molecules adhere to the periphery of the discharging openings to lower the ink-repellency, or permeate into the discharge openings and adheres to the electrothermal converting elements to lower the electrothermal conversion efficiency, which lowers the printing quality.

(3) The process for coating the electrode portion with the sealant in connection of the recording device substrate 201 with the flexible film wiring substrate 204 requires generally a counter measure against heat. A volatile low molecular component or solvent in the sealant may adhere the orifice face, nozzle inner walls, and electrothermal converting element surfaces during the curing of the sealant, which changes the wettability of these portions to the ink to deteriorate remarkably the printing quality.

(4) The sealant for the electrode portions of the recording device substrate 201 and of the flexible film wiring substrate 204 will protrude from the orifice face 207. The distance between the head and the recording medium should be made larger corresponding to the protrusion.

(5) The aforementioned protrusion may cause trouble in wiping of the orifice face 207 by a rubber blade in removing ink droplets and dusts such as paper powder therefrom. This results in adverse effects on printing quality.

(6) The inner lead bonding (ILB) by tape automated bonding (TAB) requires a high temperature above 350° C. or a supersonic working for metallic bond formation, which may cause deterioration of the nozzle member material, weakening of the adhesion between the orifice face and the underlying face, and lowers the reliability of the nozzle, thereby lowering the printing quality.

(7) In the ILB bonding by the TAB method, the plural rows of electrode terminals 208 cannot readily be arranged close to each other on the flexible film wiring substrate 204. This makes difficult the increase of arrangement density of the electrode terminals 208, or the connection density between the electrodes 210 of the recording device substrate 201.

SUMMARY OF THE INVENTION

An object of the present invention is to provide an ink-jet recording head which solves the aforementioned problems and conducts recording with high reliability and without deterioration of printing quality. Another object of the present invention is also to provide an ink-jet recording apparatus employing the above recording head.

To accomplish the objects as described above, according to a first aspect of the present invention, there is provided an ink-jet recording head comprising at least one recording device substrate for discharging a recording liquid by pressure of bubble formation caused by thermal energy, a flexible film wiring substrate for fitting the recording device substrate thereto, an electrode pad for receiving control signals from outside for controlling thermal energy generation in the recording device substrate, and a wiring substrate connected electrically to the recording device substrate with interposition of the flexible film wiring substrate, wherein an input terminal of the flexible film wiring substrate and an output terminal of the wiring substrate are electrically connected to each other and fixed by a thermosetting adhesive by hot-pressing, and the connected electrode portion is coated with the thermosetting adhesive.

In the above ink-jet recording head, an electrode terminal of the flexible film wiring substrate and an electrode of the recording device substrate may be electrically connected to each other and fixed by a thermosetting adhesive by hot-pressing, and the connected electrode portion may be coated with the thermosetting adhesive.

In the above ink-jet recording head, the electrode portion connected and fixed by the thermosetting adhesive may be further sealed with a sealant. In this case, the thermosetting adhesive may be mainly composed of an epoxy resin, and the sealant may be mainly composed of a silicone resin. The protrusion of the thermosetting adhesive from the edge portion of the flexible film wiring substrate may be limited, for example, to be not more than 0.5 mm.

The above ink-jet recording head may be constructed such that the recording device substrate is held on a liquid supplying-holding member for supplying the recording liquid to the recording device substrate, and the wiring substrate is held in a face adjacent to the recording device substrate-holding face of the liquid supplying-holding member.

The above ink-jet recording head may be constructed such that the input terminal portion of the flexible film wiring substrate is fixed between the input terminal provided at the reverse face of the wiring substrate and the liquid supplying-holding member.

According to a second aspect of the present invention, there is provided an ink-jet recording head comprising a recording device substrate for discharging a recording liquid by pressure of bubble formation caused by thermal energy, and a flexible film wiring substrate for fitting the recording device substrate thereto, wherein an electrode terminal of the flexible film wiring substrate and an electrode of the recording device substrate is connected electrically to each other and fixed by a thermosetting adhesive by hot-pressing, and the connected electrode portion is coated with the thermosetting adhesive.

According to a third aspect of the present invention, there is provided a process for producing an ink-jet recording head comprising a recording device substrate for discharging a recording liquid by pressure of bubble formation caused by thermal energy, a flexible film wiring substrate for fitting the recording device substrate thereto, an electrode pad for receiving control signals from outside for controlling thermal energy generation in the recording device substrate, and a wiring substrate connected electrically to the recording device substrate with interposition of the flexible film wiring substrate, which process comprises the steps of:

applying a thermosetting adhesive to at least one of an input terminal of the flexible film wiring substrate and an output terminal of the wiring substrate;

electrically connecting the input terminal to the output terminal by hot-pressing to fix the input terminal and output terminal in an electric connection state.

The ink-jet recording head according to the above first, second and third embodiments may be constituted such that the electrodes of the recording device substrate are formed along the outer peripheral portion of the substrate, the electrode terminals of the flexible wiring substrate are formed at the positions counter to the above electrodes on the reverse face of the substrate, and the electrode terminals and the electrodes are respectively connected electrically and fixed by a thermosetting adhesive by hot-pressing.

The above ink-jet recording head may be constituted such that the electrodes of the recording device substrate are formed in plural rows along the sides of the substrate, the electrode terminals of the flexible wiring substrate are formed at positions counter to the above electrodes on the reverse face of the substrate, and the electrode terminals and the electrodes are respectively fixed and connected electrically by a thermosetting adhesive by hot-pressing.

The electrode portions coated with the adhesive may be made lower than the height of the orifice face of the recording device substrate having discharge openings for discharging the liquid.

The thermosetting adhesive may be an anisotropic electroconductive adhesive containing electroconductive particles, and the electric connection may be conducted by the electroconductive particles.

According to a further aspect of the present invention, there is provided an ink-jet recording apparatus which employs any one of the above ink-jet recording heads set on a carriage capable of reciprocating in the secondary recording direction to conduct recording on a recording medium.

In the present invention, as described above, the flexible film wiring substrate is connected to the wiring substrate by use of a thermosetting adhesive or an anisotropic conductive adhesive containing a particulate electroconductive material by hot pressing instead of conventional solder connection, and the connected electrode portions are covered with the adhesive, whereby direct finger contact or ink deposition to the electrode portions is prevented. In the present invention, since no solder is used for the connection, removal of an oxide film and dirt on the electrode portions need not be conducted, and clogging of ink discharge opening of the recording device substrate which will be caused by splashing of flux on soldering does not occur and therefore deterioration of the printing quality does not occur. Decrease of ink repellency by attachment of an ionic gas generated from the residual flux after soldering to the vicinity of the discharge opening does not occur. Decrease of the heat conversion efficiency by attachment of the gas intruding into the ink discharge opening to the electrothermal converting element does not occur.

In the present invention, the electrode portions need not be sealed with a sealant differently from the conventional recording head, since the electrodes of the flexible film wiring substrate and the electrodes of the recording device substrate are connected electrically and fixed by use of a thermosetting adhesive by hot pressing. Since in the present invention not employing the sealant, a volatile low molecular component or a solvent component is not attached to to the orifice face, the nozzle inside walls, or the surface of the electrothermal converting elements, serious deterioration of printing quality owing to change in ink-wettability does not occur.

In the constitution of the present invention, the electrode portions coated with an adhesive are formed lower than the level of the orifice face having discharge openings. Therefore, the interspace between the head and the recording medium can be determined by the distance between the orifice face and the recording medium. The coated electrode portions are at a level lower than the orifice face, therefore, no trouble being caused in cleaning of the orifice face by a rubber blade.

In the constitution of the present invention in which the electrode terminals of the flexible film wiring substrate and the electrodes of the recording device substrate are connected electrically and fixed by an anisotropic conductive adhesive containing a particulate electroconductive material by hot pressing, neither a high temperature treatment at 350° C. or higher nor a supersonic treatment is conducted for the intermetallic bonding. Therefore, the nozzle member formed on the orifice face does not deteriorate, or the adhesion of the orifice face to the underlaying layer is not weakened, thereby the nozzle reliability being not impaired differently from conventional techniques.

In conventional recording heads, the electrode terminals of the flexible film wiring substrate protrude from the organic base material, so that it is extremely difficult to form the electrodes in plural rows along the sides of the recording device substrate to increase the connection densities of the electrodes. In the present invention, the electrode terminals of the flexible film wiring substrate are provided on the reverse face of the substrate, whereby the electrodes of the recording device substrate can be formed in plural rows along the side of the substrate to increase the electrode connection density.

BRIEF DESCRIPTION OF THE DRAWINGS

FIG. 3A is a perspective view showing a separated state, and FIG. 3B is a perspective view of a combined state.

FIG. 5A is a perspective view showing a separated state, and FIG. 5B is a perspective view showing a combined state.

FIG. 6A is a perspective view showing a separated state, and FIG. 6B is a perspective view showing a combined state.

DESCRIPTION OF THE PREFERRED EMBODIMENTS

The embodiments of the present invention are described by reference to drawings.

EXAMPLE 1

Figure 1A:
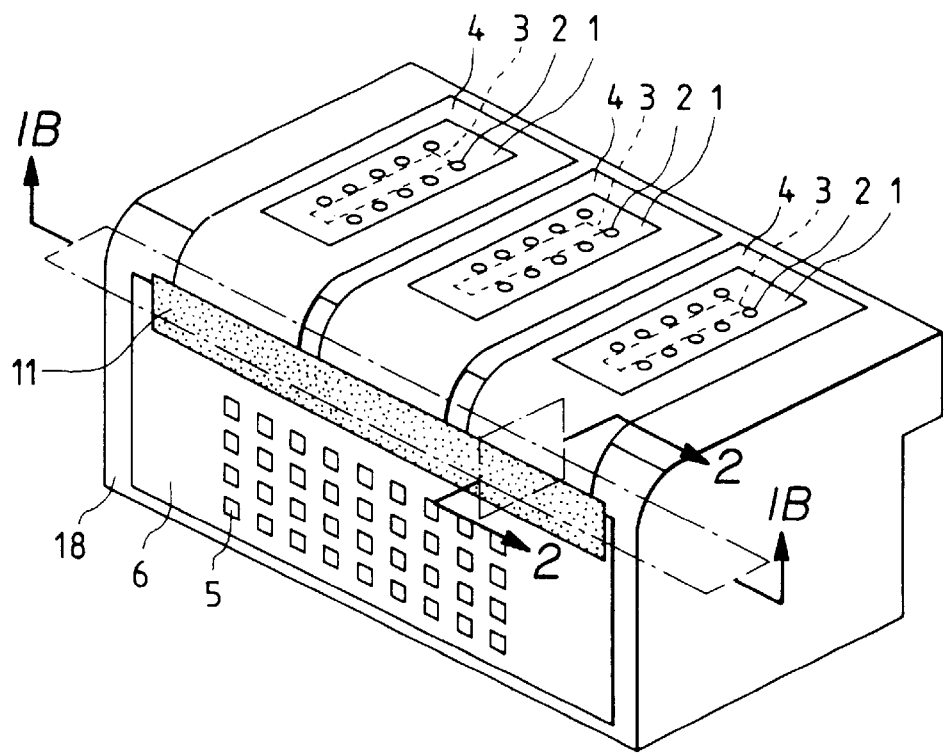
FIG. 1A is a perspective view for explaining an ink-jet recording head of Example 1 of the present invention.
Figure 1B:
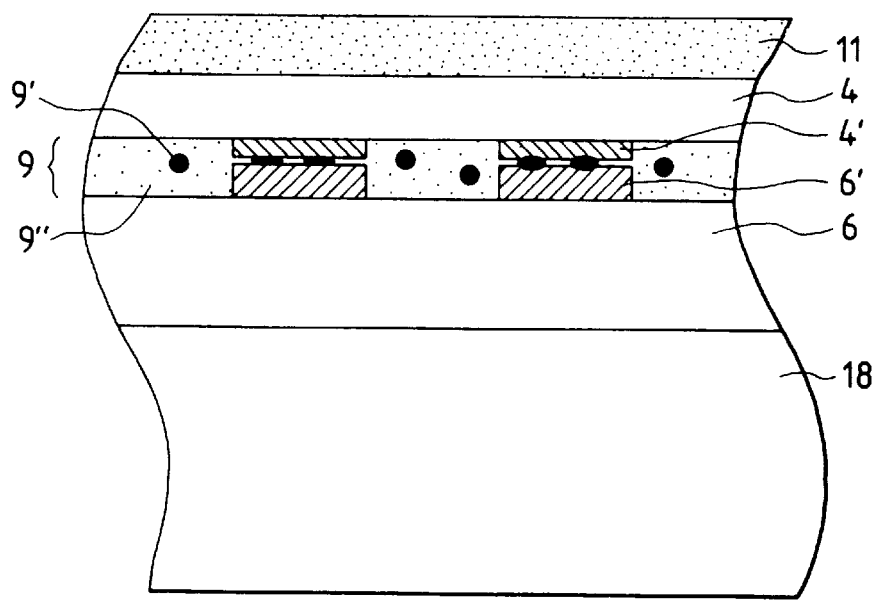
FIG. 1B is a sectional view taken along the plane 1B in FIG. 1A.

FIG. 1A is a perspective view of an ink-jet recording head of Example 1 of the present invention, and FIG. 1B is a sectional view taken along the plane 1B in FIG. 1A.

In FIG. 1A, plural discharge openings 2 are formed for discharging ink at the central portion on the front face of a recording device substrate 1. On the reverse face of the substrate, an ink-supplying opening 3 (broken line in the drawing) is provided in a length nearly equal to the length of the row of the discharge openings. An ink supplying-holding member 18 holds three recording device substrates 1, and recording liquid is supplied to the respective recording device substrate 1. In a multi-color head, respective color recording liquids are separately held in respective color-recording device substrates 1 of the ink supplying-holding member 18. In a high-speed head, the ink supplying-holding member 18 holds single color recording liquid.

For ink discharge, electrodes on the recording device substrate 1 are electrically connected to electrode terminals on a flexible film wiring substrate 4. The input terminals of the flexible film wiring substrate are electrically connected to output terminals of a wiring substrate 6 having external input pads 5 for inputting electric signals of recording information and the like from a recording apparatus body to the ink-jet recording head.

The connection portions of the input terminals of respective flexible film wiring substrates 4 with the output terminals of the wiring substrate 6 are covered with a sealant 11 to prevent direct finger touch and ink attachment to the connection portion. The recording device substrates are held by the ink supplying-holding member 18 on a different face from the wiring substrate 6 on the ink supplying-holding member 18. With this constitution, the ink discharge direction (recording paper face) is different from the connection direction of the input pads 5 on the wiring substrate 6, thereby freedom in design of the paper feeding mechanism being increased.

As shown in FIG. 1B, the output terminals 6' of the wiring substrate 6 and the input terminals 4' of the respective flexible film wiring substrates are connected electrically and fixed by hot pressing with an anisotropic conductive adhesion film composed of electroconductive particles 9' and an adhesive 9". In the connection and fixation by the anisotropic conductive adhesion film 9 by hot pressing, the terminals (4', 6') are electrically connected by the electroconductive particles 9' and are fixed by the adhesive 9", while the non-terminal portions are fixed by the adhesive 9" without electrical connection.

The aforementioned anisotropic conductive adhesion film 9, for example, may be composed mainly of electroconductive nickel particles of primary diameter of 2 to 6 $\mu$m and an epoxy resin. By use of an anisotropic conductive adhesion film 9, the gold-plated output terminals 6' of the wiring substrate 6 and the gold-plated input terminals 4' of the respective flexible film wiring substrate are hot-pressed at a temperature of from 17° C. to 250° C. under a pressure of about 4 MPa. Thereby satisfactory electric connection and fixation can be achieved with a resistance of not higher than 10 m$\Omega$ for one terminal (terminal width: 170 $\mu$m).

As described above, the anisotropic conductive adhesion film 9 as the connecting material renders unnecessary the use of a flux as the active material for removing an oxide film and dirt from the terminal portions, thus eliminating the adverse effects of splashing of the flux and ionic gas generation from the residue of the flux.

Figure 2:
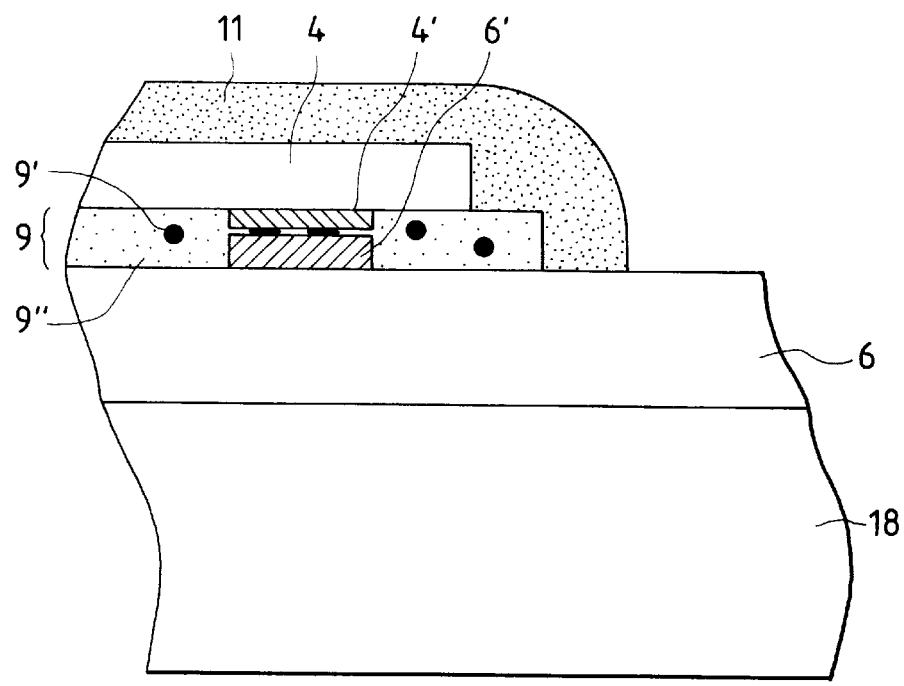
FIG. 2 is a sectional view of the portion of the head taken along the plane 2 of FIG. 1A.

The sealing agent 11, when applied on the anisotropic adhesive film 9, tends to be repelled to make instable the application of the sealing agent. Therefore, preperably the anisotropic conductive adhesion film 9 is not exposed to the outside of the flexible film wiring substrate 4. Specifically, as shown in FIG. 2, the sealing agent 11 can be stably applied by decreasing the length of protrusion of the anisotropic conductive adhesive 9 from the end of the flexible film wiring substrate 4. Experimentally, when the sealing agent 11 is mainly composed of the aforementioned epoxy resin, direct finger touch and attachment of splashed ink onto the terminal connection portions can be prevented by controlling the length of protrusion of the anisotropic conductive adhesive 9 from the end of the flexible film wiring substrate 4 to be not more than 0.5 mm.

In the above example, the anisotropic conductive film containing electroconductive particles is used for electric connection and fixation of the input terminals 4' of the flexible film wiring substrate 4 and the output terminals 6' of the wiring substrate 6. Alternatively, the electrical connection and fixation may be made by use of a thermosetting adhesive which contains no electroconductive particle by hot pressing.

Next, the connection of the recording device substrate 1 and the flexible film wiring substrate 4 is explained.

Figure 4:
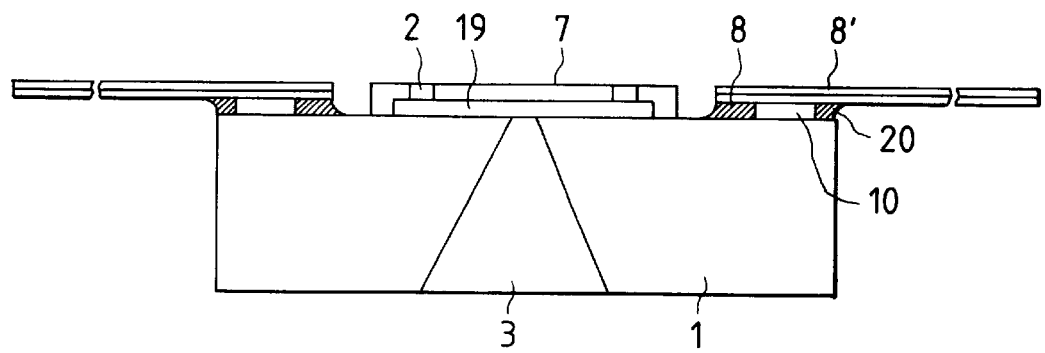
FIG. 4 is a sectional view taken along the line 4—4 in FIG. 3B.
Figure 3A:
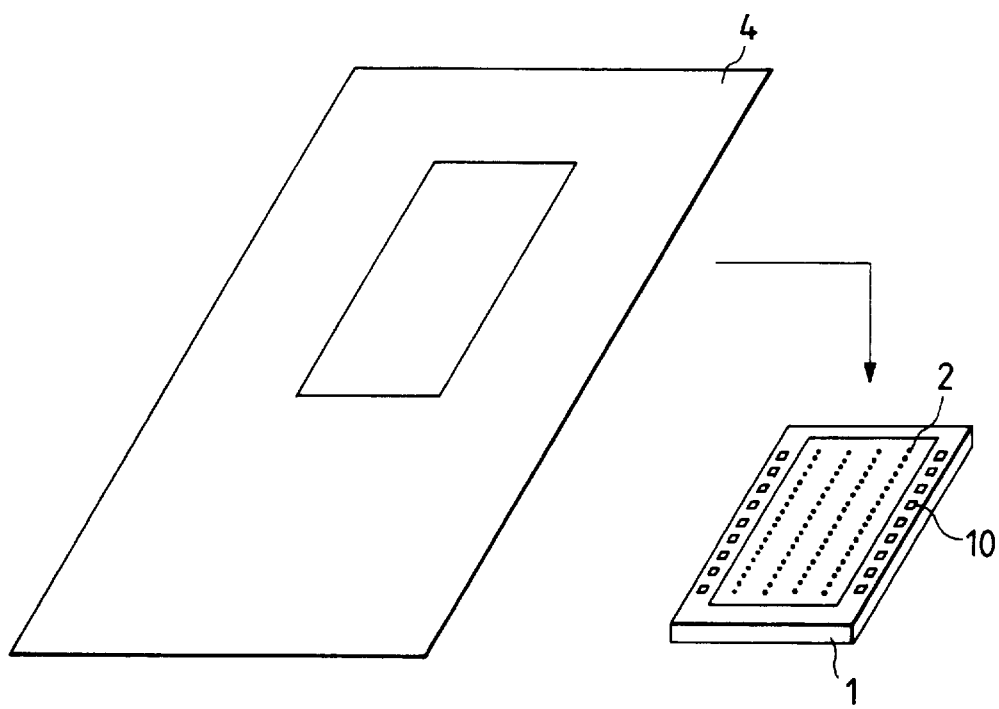
FIG. 3A and FIG. 3B are views for explaining combination of a recording device substrate with a flexible film wiring substrate.
Figure 3B:
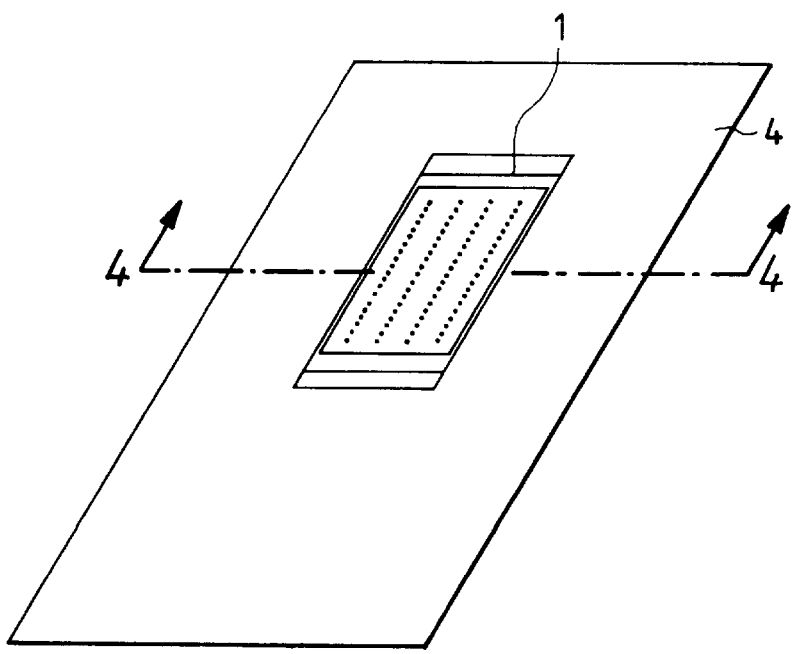

FIGS. 3A and 3B illustrate structure of the connection between the recording device substrate 1 and the flexible film wiring substrate 4. FIG. 3A shows a separated state, and FIG. 3B shows the state of the recording device substrate fitted to the flexible film wiring substrate. FIG. 4 is a sectional view taken along the line 4—4 in FIG. 3B.

A plurality of electrothermal converting elements (not shown in the drawing) are formed on the surface of the recording device substrate 1. Ink flow paths 19 are formed in the regions having the electrothermal converting elements. Plural discharge openings 2 are formed on the orifice face 7 constructing the ceiling of the ink paths 19 corresponding to the respective electrothermal converting elements. The ink paths 19 communicate to an ink supply opening 3 for supply of the recording liquid.

On the end of the face of the recording device substrate 1, plural electrodes 10 are provided, in a row, which receive electric signals for controlling energy generation in the aforementioned electrothermal converting elements. The flexible film wiring substrate 4 has an aperture to uncover the orifice face 7 having the discharge openings 2 when the recording device substrate 1 is fitted thereto. On the reverse face of the substrate around the aperture, electrode terminals 8 are provided to be connected to the electrodes 10 of the recording device substrate 1.

The recording device substrate 1 is connected and fixed as shown in FIG. 4 by applying an epoxy type thermosetting adhesive 20 (or placing semi-cured thermosetting adhesive 20) on the portions of the electrodes 10 of the recording device substrate 1, or the electrode terminals 8 of the flexible film wiring substrate 4; positionally registering and temporarily bonding the electrodes 10 and the electrode terminals 8; and hot pressing with a heating jig from the side of the flexible film wiring substrate 4. Experimentally, the electrodes 10 and the electrode terminals 8 were connected electrically satisfactorily and fixed sufficiently under a pressure of 2 to 6 MPa at a resin-heating temperature of 160° C. to 220° C. for 2 to 10 seconds.

In this example, the total of the thicknesses of the electrode 10, the electrode terminal 8, and the base film 8' is adjusted to be smaller than the height of the orifice face 7. Specifically, the electrode 10 on the recording device substrate 1 has a thickness of 10 to 40 $\mu$m, the electrode terminal 8 on the back face of the flexible film wiring substrate 4 has a thickness of 12 to 45 $\mu$m, the base film 8' which is made of an organic resin and is a base of the flexible film wiring substrate has a thickness of 12 to 50 $\mu$m, and the orifice face 7 has a height of 20 to 50 $\mu$m. This constitution in which the total of the thicknesses of the electrode 10, the electrode terminal 8, and the base film 8' is smaller than the height of the orifice face 7 facilitates wiping with a rubber blade to remove ink drops and dirt such as paper powder adhering to the orifice face 7.

Further, the connection portions (electrode portions) between the electrode 10 and the electrode terminal 8 are fixed and completely covered with the thermosetting adhesive 20. Thereby, direct finger touch with the electrode portion or ink attachment thereto is prevented. Thus, sealing of the electrode portions with a sealant is not necessary, and the sealing process is not required.

The thermosetting adhesive 20 may be an anisotropic conductive adhesive containing electroconductive particles, and the electrodes 10 and the electrode terminals 8 may be electrically connected and fixed by the anisotropic conductive adhesive by hot pressing. In such connection and fixation by hot pressing with anisotropic conductive adhesive, the electrodes 10 and the electrode terminals 8 are electrically connected by the electroconductive particles and fixed by the adhesive, and in the portions where the terminal is not provided, the base film and the recording device substrate are bonded together by the adhesive without electric connection by electroconductive particles.

With the constitution in which the electrode terminals 8 are provided on the reverse face of the flexible film wiring substrate 4 and are connected and fixed to the electrodes 10 of the recording device substrate 1 by an adhesive, the electrodes 10 and the electrode terminals 8 can be arranged as desired corresponding to the design.

Figure 5A:
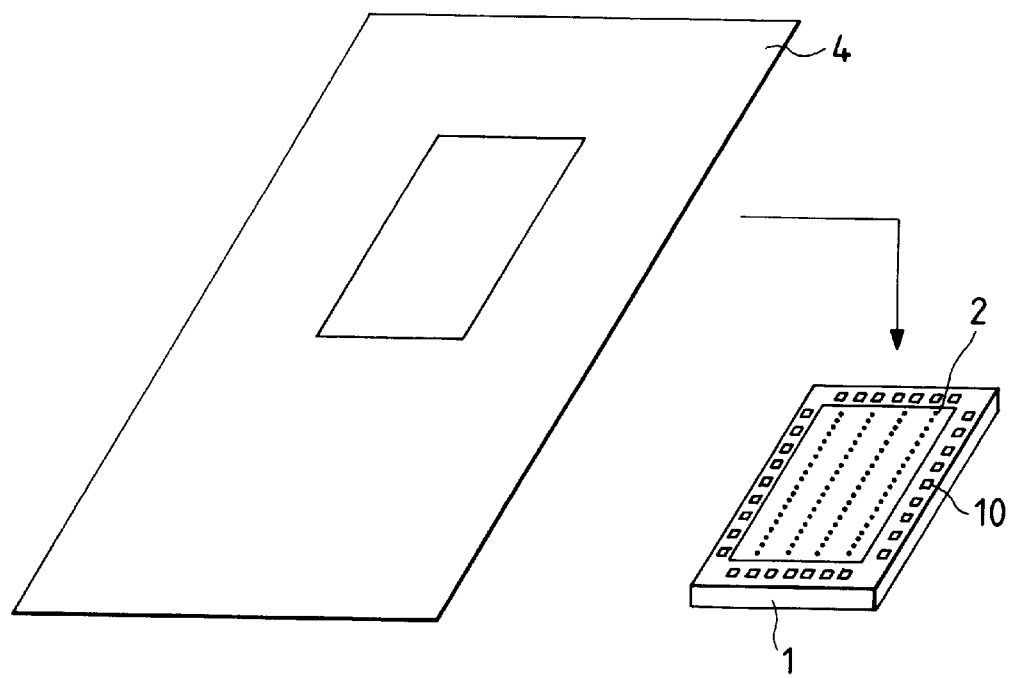
FIG. 5A and FIG. 5B are views for explaining connection of a flexible film wiring substrate with a recording device substrate in which electrodes are formed along the periphery of the recording device substrate.
Figure 5B:
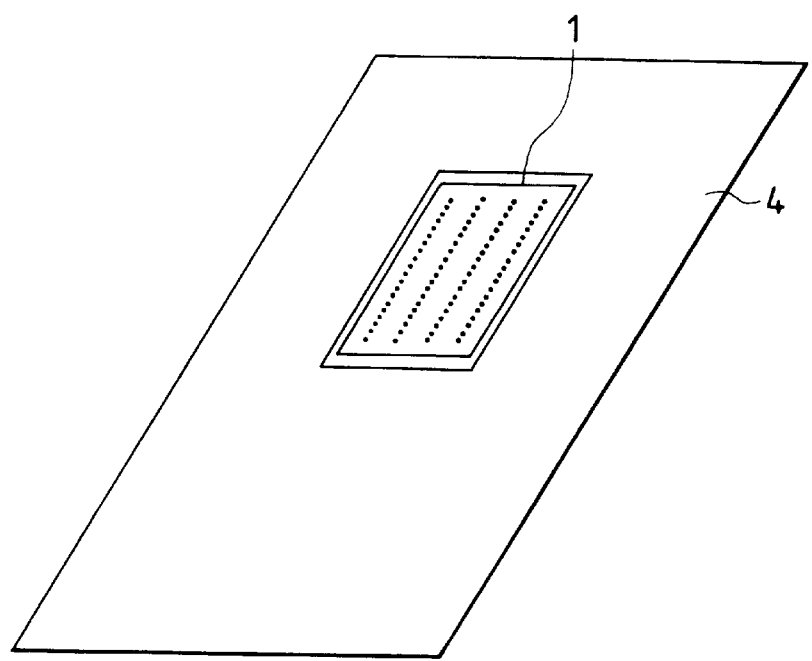

In FIGS. 5A and 5B, for example, the electrodes 10 are formed along the periphery of the recording device substrate 4, and the electrode terminals 8 are formed around the aperture on the back face of the flexible film wiring substrate 4 corresponding to the positions of the electrodes 10. In this constitution, the recording device substrate 1 is bonded along the entire periphery to the flexible film wiring substrate 4 to improve the adhesion strength between the substrates without a vent formation, causing neither penetration nor attachment of the recording liquid through the vent hole.

Figure 6A:
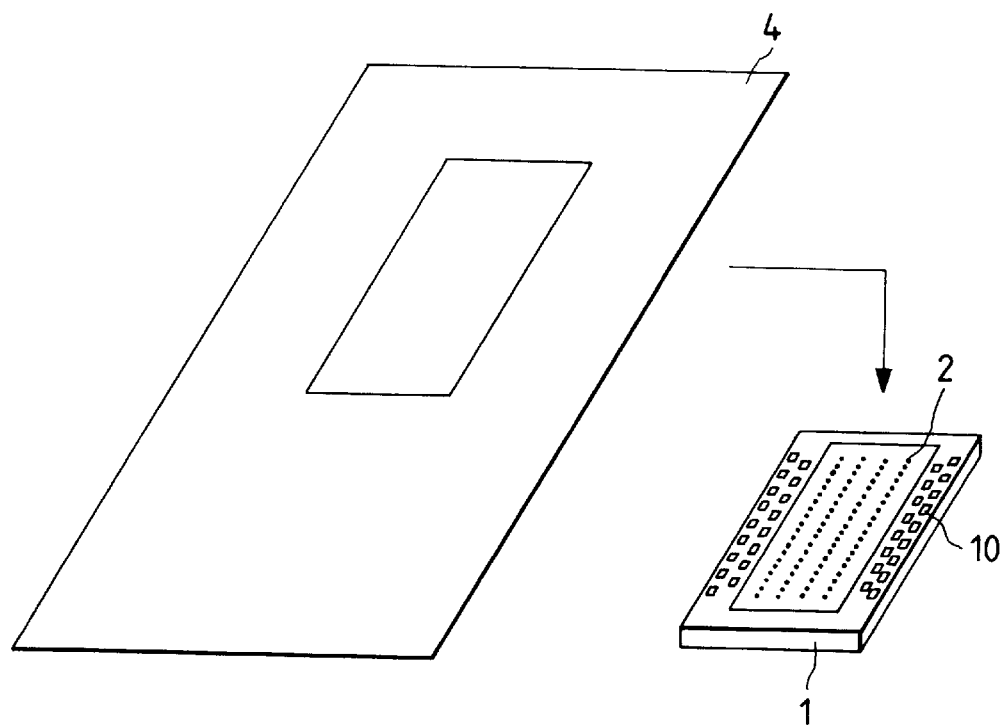
FIG. 6A and FIG. 6B are views for explaining connection of a flexible film wiring substrate with a recording device substrate in which electrodes are formed in plural rows along the periphery of the recording device substrate.
Figure 6B:
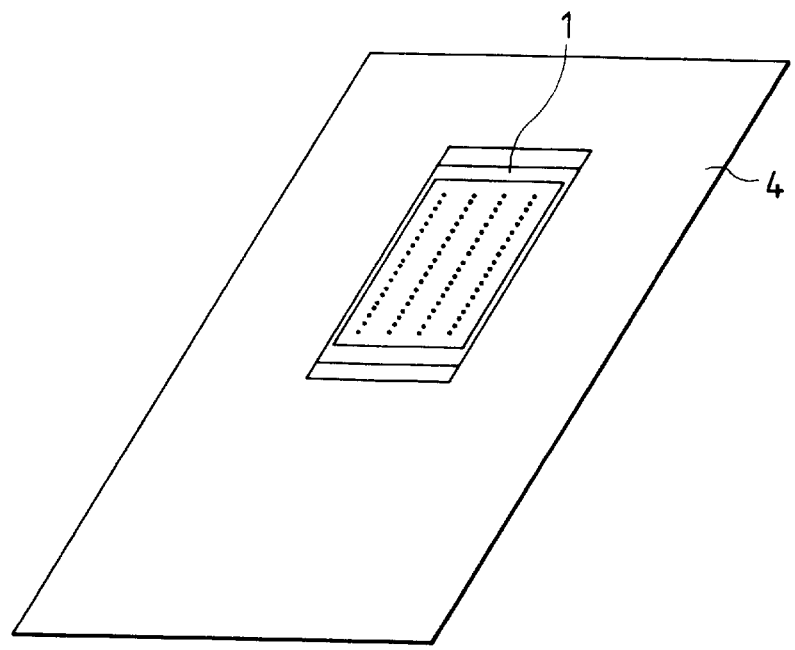
Figure 11:
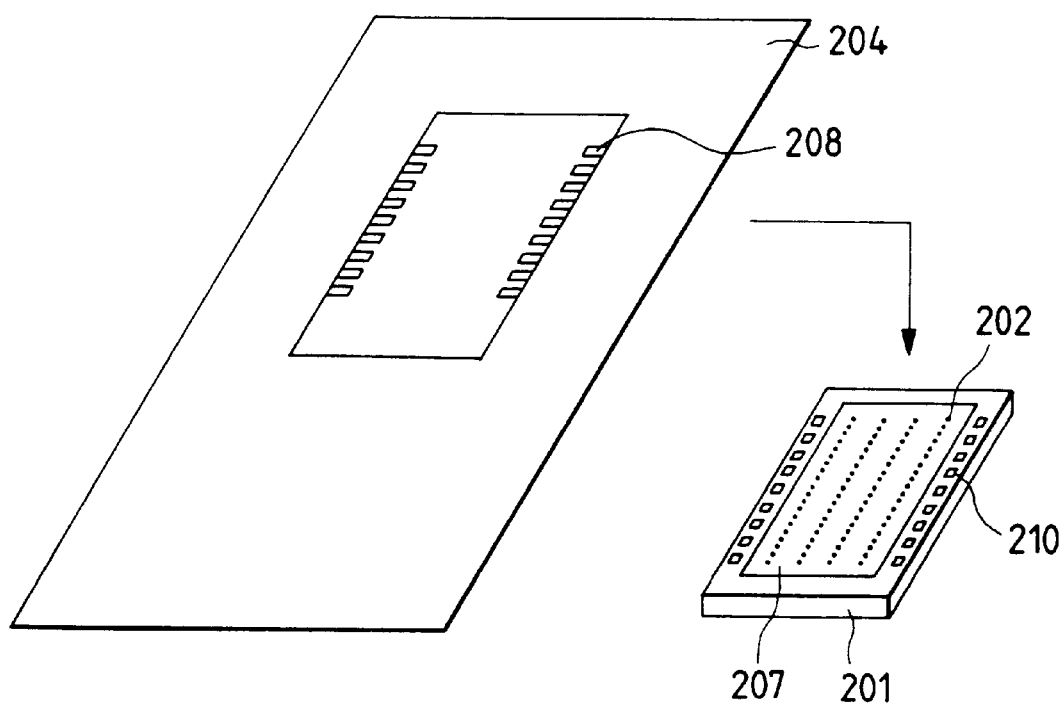
FIG. 11 illustrates a concrete structure of a recording device substrate and a flexible film wiring substrate.
Figure 13:
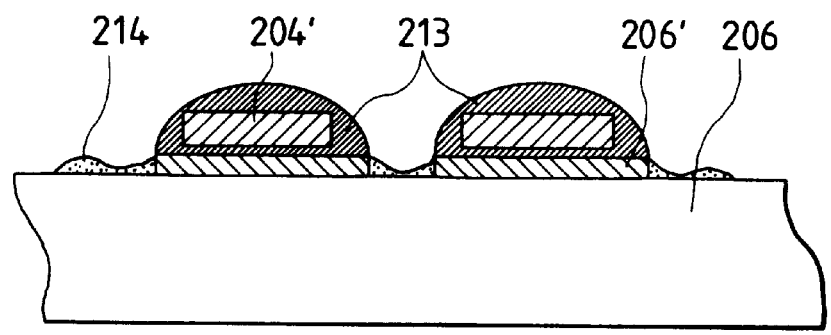
FIG. 13 is a sectional view taken along the plane 13 in FIG. 10.
Figure 12A:
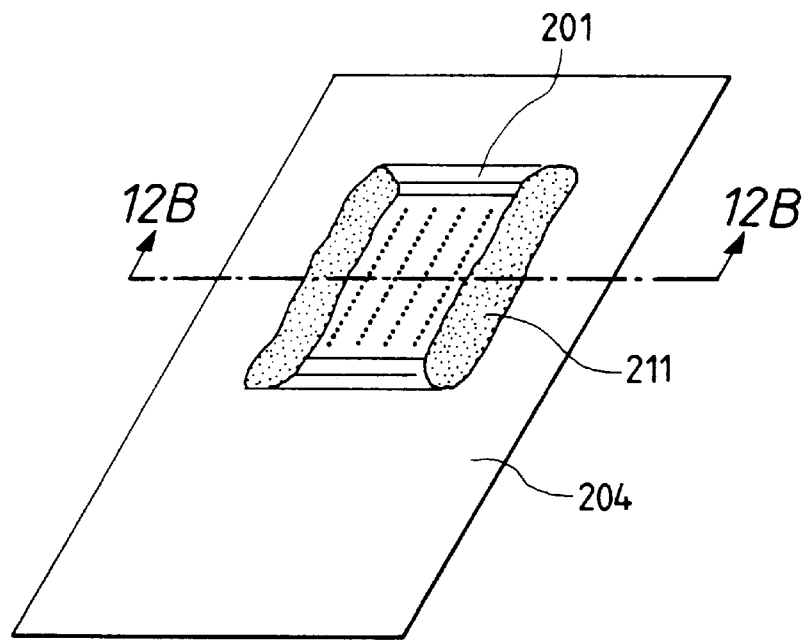
FIG. 12A is a perspective view showing combination of a recording device substrate with a flexible film wiring substrate.
Figure 12B:
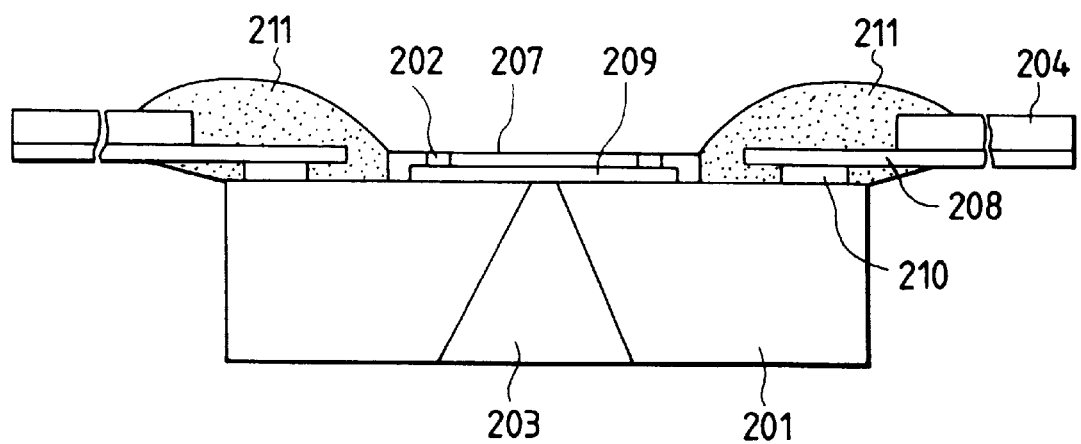
FIG. 12B is a sectional view taken along the line 12B—12B in FIG. 12A.

In FIGS. 6A and 6B, the electrodes 10 are formed in plural rows to increase the electrical connection density between the recording device substrate 1 and the flexible film wiring substrate 4. Such construction cannot readily be achieved in the structure shown in aforementioned FIG. 11 in which the electrode terminals 8 of the flexible film wiring substrate 4 protrude from the organic material substrate to the aperture. In this example, such a construction can be realized by providing the electrode terminals 8 on the reverse face of the flexible film wiring substrate 4 and connecting and fixing the electrode terminals to the electrode 10 of the recording device substrate 1 with an adhesive.

EXAMPLE 2

In the structure in which the wiring substrate 6 and the recording device substrates 1 are held on separate planes, the flexible film wiring substrate should be tightly held and protected in consideration of the connection with connector parts for external input pads for application of electric signals of recording information from the recording apparatus body to the ink-jet recording head.

Figure 7:
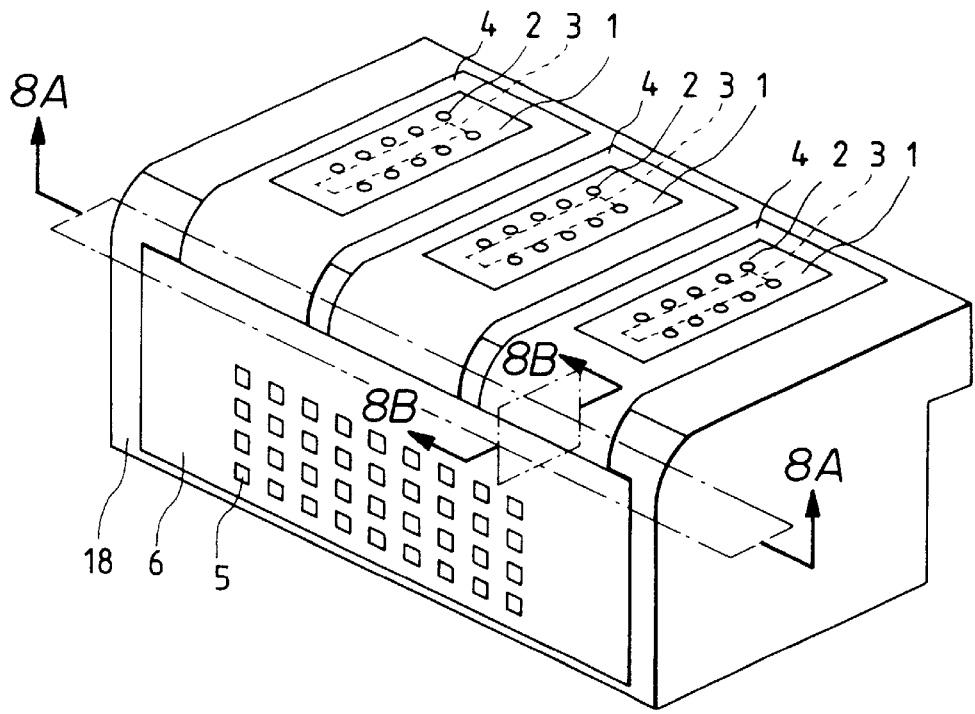
FIG. 7 is a perspective view of an ink-jet recording head of Example 2 of the present invention.
Figure 10:
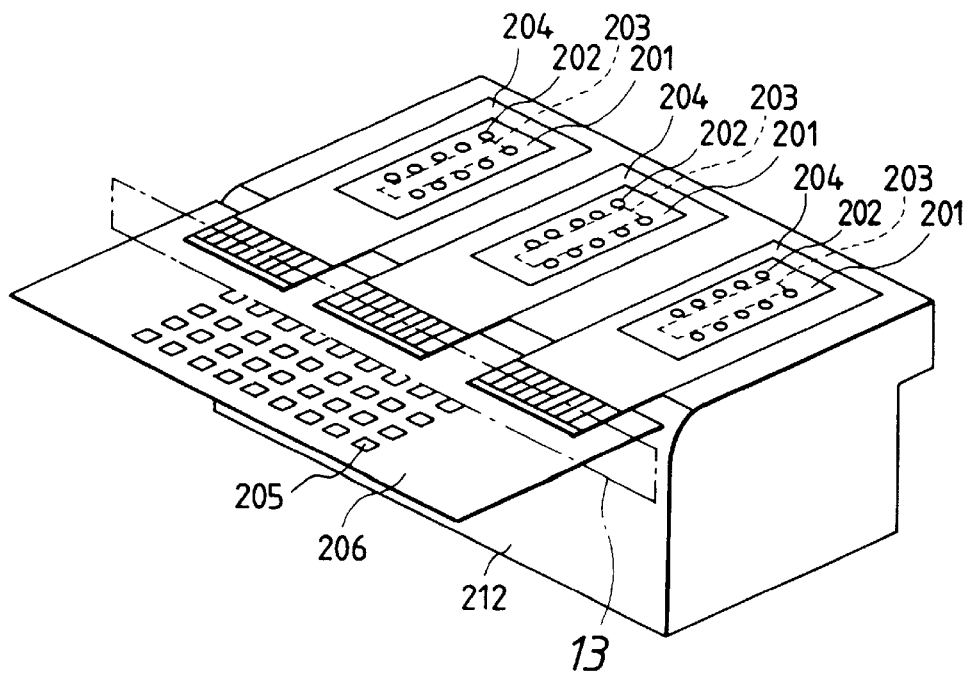
FIG. 10 is a perspective view of a side shooter type recording head.
Figure 8A:
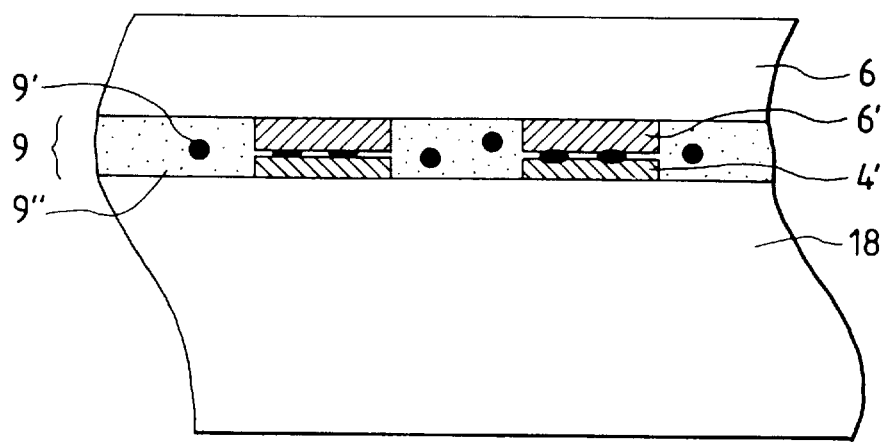
FIG. 8A is a sectional view taken along the plane 8A in FIG. 7.
Figure 8B:
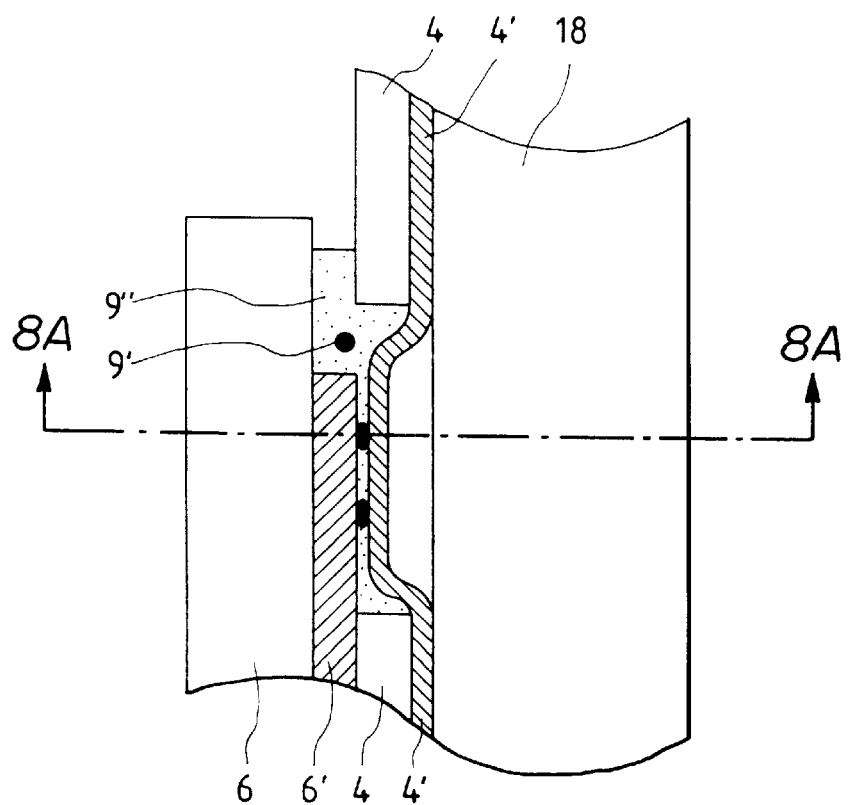
FIG. 8B is a sectional view taken along the plane 8B in FIG. 7.

FIG. 7 is a perspective view of an ink-jet recording head of this Example 2 of the present invention. FIG. 8A is a sectional view taken along the plane 8A in FIG. 7, and FIG. 8B is a sectional view taken along the plane 8B in FIG. 7. In these drawings, the same reference numbers are used for the same members as in FIG. 1.

In the recording head of this example, as shown in FIGS. 7, 8A, and 8B, the input terminal 4' of the flexible film wiring substrate 4 having the recording device substrates 1 fitted thereto is held between an output terminal 6' provided on the reverse face of the wiring substrate 6 having many external input pads 5 and an ink supplying-holding member 18. An anisotropic conductive adhesion film 9 is provided between the input terminal 4' of the flexible film wiring substrate 4 and the output terminal 6' of the wiring substrate 6 to connect electrically and fix the terminals (4' and 6') by hot pressing.

In the above constitution, the input terminals 4' of the flexible film wiring substrate 4 are held tightly and protected between the output terminals 6' on the reverse face of the wiring substrate 6 and the ink supplying-holding member 18. Thereby direct finger touch or ink attachment is prevented. The anisotropic conductive adhesion film 9, which electrically connects and fixes the terminals (4', 6'), offsets the adverse effects of a splashed flux and an ionic gas evolved from the residue of the flux.

In Example 1 as described above, the connection portions of the input terminal of the flexible film wiring substrate 4 with the output terminal of the wiring substrate 6 are coated with a sealing agent 11 to prevent direct finger touch and ink penetration. In this Example also, the coating of the terminal connection portions with a sealing agent will prevent the penetration of ink and improve further the reliability of the terminal connection portions.

The above Examples describe a side-shooter type recording head. The present invention also can be applied to an edge-shooter type of recording head, thereby obtaining the same effect as of the side-shootor type.

The present invention also can be applied to a flexible film wiring substrate of a TCP (tape carrier package) having a recording device substrate fitted thereto by a TAB process to prevent deterioration of the printing quality.

The recording with the recording head of the present invention can be carried out on a recording medium such as paper, thread, fiber, cloth, leather, metal, plastics, glass, wood, ceramics or the like.

The recording liquid for the recording head of the present invention is not limited to ink, and any material is useful which can be discharged and conduct recording on the above recording medium.

Ink-Jet Recording Apparatus

An ink-jet recording apparatus employing the ink-jet head of the above examples is described below.

Figure 9:
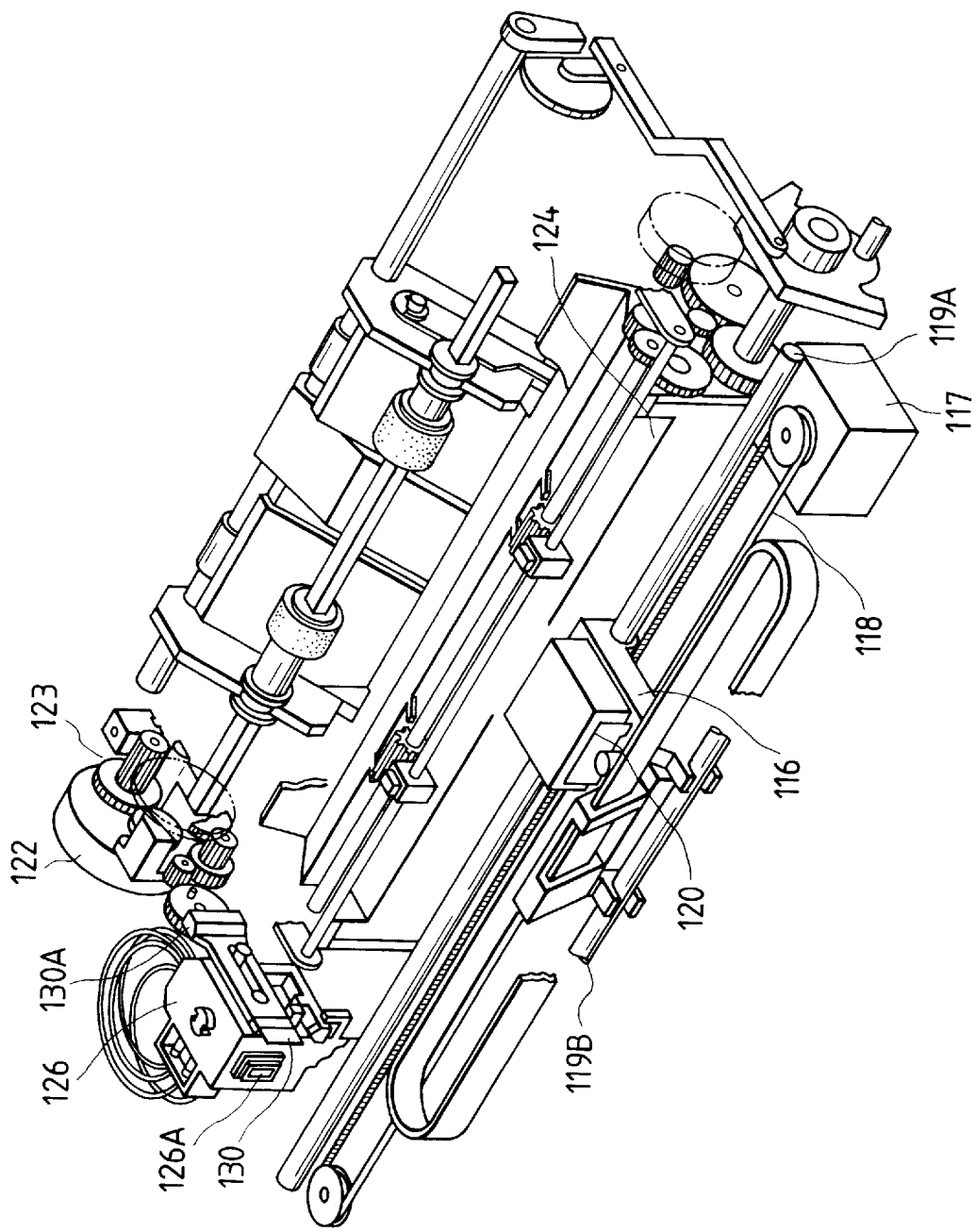
FIG. 9 is an external perspective view of an example of an ink-jet recording apparatus (IJRA) equipped with a recording head of the present invention as the ink-jet head cartridge (IJC).

FIG. 9 is an perspective external view of an example of an ink-jet recording apparatus (IJRA) employing an ink-jet recording head of the present invention as an ink-jet head cartridge (IJC).

In FIG. 9, an ink-jet head cartridge (IJC) 120 has nozzles for discharging ink onto a recording face of a recording paper sheet fed onto a platen 124. A carriage HC 116 holds IJC 120, and is slidable along two parallel guide shafts 119A and 119B by a driving belt 118 driven by a motor 117. Thereby, the IJC 120 can reciprocate over the entire breadth of the recording paper sheet.

A head recovery device 126 is placed at an end of the moving route of the IJC 120, for example, in opposition to the home position thereof. The head recovery device 126 is operated by the driving force applied through a transmission mechanism 123 to conduct capping of the IJC 120. Simultaneously with the capping of IJC 120 by the cap portion 126A of the head recovery device 126, a discharge recovery treatment is conducted such that the thickened ink is removed forcibly from the nozzle by sucking of the ink by a sucking means provided in the head recovery device 126 or by feeding of ink by a pressurizing means provided in the ink feeding path to the IJC 120. The IJC after the recording is protected by capping.

A blade 130 made of a silicone rubber is placed as a wiping member at the side of the head recovery device 126. The blade 130 is held by a blade-holding member 130A in a cantilever state, and driven by the motor 122 and the transmission mechanism 123 similarly as the head recovery device 126 to fit to the discharging face of the IJC 120. The blade 130 is allowed to protrude to the movement route of the IJC 120 at a suitable time during the recording operation of IJC 120 or after the discharge recovery by the head recovery device 126 to wipe off condensed dew, wet, or dirt on the discharge face of the IJC 120.

The above ink-jet recording apparatus is applicable to various apparatuses such as printers, copying machines, facsimile machines having a communication system, and word processors having a printer, and industrial recording apparatuses combined with other treatment apparatus.

As described above, the present invention makes unnecessary the use of a flux to remove an oxide film or dirt, thereby preventing clogging of the discharge opening of the recording device substrate by a splashed flux; preventing attachment of ionic gas molecules evolved from residual flux after soldering to the vicinity of the discharge opening, which causes lowering of the water repellency of the ink; or preventing attachment of the ionic gas molecules to the electrothermal converting element through the discharge opening, which causes lowering of the printing quality. Thus, an ink-jet recording head with high reliability can be provided.

In the present invention, the connection portions of electrode terminals of the flexible film wiring substrate with the electrodes of the recording device substrate need not be sealed with a sealant. Therefore, deterioration of printing quality owing to change in ink-wettability does not occur which may be caused by attachment of a volatile low molecular component or a solvent component to the orifice face, the nozzle inside walls, or the surface of the electrothermal converting elements. Thereby, printing can be conducted stably with high quality.

In the constitution of the present invention, the electrode portions coated with an adhesive are formed lower than the level of the orifice face having discharge openings. Therefore the interspace between the head and the recording medium can be determined by the distance between the orifice face and the recording medium, so that the head portion can be constituted more compactly. Further, the coated electrode portions are at a level lower than the orifice face, therefore, no trouble being caused in cleaning of the orifice face by a rubber blade.

In the constitution of the present invention in which the electrode terminals of the flexible film wiring substrate and the electrodes of the recording device substrate are connected electrically and fixed by an anisotropic conductive adhesive containing electroconductive particles by hot pressing, a high temperature treatment at 350° C. or a supersonic treatment is not required for the intermetallic bonding. Therefore, the nozzle member formed on the orifice face does not deteriorate, or the adhesion of the orifice face to the underlaying layer is not weakened, thereby the nozzle reliability being not impaired.

In conventional recording heads, the electrode terminals of the flexible film wiring substrate protrude from the organic base material, so that it is extremely difficult to form the electrode terminals in plural rows along the sides of the recording device substrate to increase the connection densities of the electrodes. In the present invention, the electrode terminals of the flexible film wiring substrate are provided on the reverse face thereof, whereby the electrodes of the recording device substrate can be formed in plural rows along the side of the substrate to increase the electrode connection density.

What is claimed is:

1. An ink-jet recording head comprising a recording device substrate for discharging a recording liquid by pressure of bubble formation caused by thermal energy, a flexible film wiring substrate fitted to the recording device substrate, an electrode pad for receiving control signals from outside for controlling thermal energy generation in the recording device substrate, and a wiring substrate connected electrically to the recording device substrate with interposition of the flexible film wiring substrate, wherein an input terminal of the flexible film wiring substrate and an output terminal of the wiring substrate are electrically connected together and are fixed to each other by a thermosetting adhesive by hot-pressing, and a portion of that connected portion is coated with the thermosetting adhesive, wherein the portion of that connected portion is further sealed by a sealant, and wherein the thermosetting adhesive does not protrude from the edge portion of the flexible film wiring substrate by more than 0.5 mm.

2. The ink-jet recording head according to claim 1, wherein an electrode terminal of the flexible film wiring substrate and an electrode of the recording device substrate are electrically connected together and fixed to each other by the thermosetting adhesive by hot-pressing, and a portion of the electrode which is connected is coated with the thermosetting adhesive.

3. The ink-jet recording head according to claim 2, wherein the portion of the connected electrode which is coated with the adhesive is lower in height than an orifice face of the recording device substrate having a plurality of discharge openings for discharging a liquid.

4. The ink-jet recording head according to claim 1, wherein the thermosetting adhesive comprises an epoxy resin, and the sealant comprises a silicone resin.

5. The ink-jet recording head according to claim 1, wherein the recording device substrate is held on a liquid supplying-holding member for supplying a recording liquid to the recording device substrate, and the wiring substrate is held on a face adjacent to a recording device substrate-holding face of the liquid supplying-holding member.

6. The ink-jet recording head according to claim 5, wherein the input terminal of the flexible film wiring substrate is fixed between the output terminal provided at a reverse face of the wiring substrate and the liquid supplying-holding member.

7. The ink-jet recording head according to claim 1, wherein the electrode of the recording device substrate is formed along an outer peripheral portion of the recording device substrate, the electrode terminal of the flexible film wiring substrate is formed at a position opposing the electrode on a reverse face of the flexible film wiring substrate, and the electrode terminal and the electrode are respectively connected electrically and are fixed together by a thermosetting adhesive by hot-pressing.

8. The ink-jet recording head according to claim 1, wherein the recording device substrate has a plurality of sides and a plurality of electrodes and the electrodes of the recording device substrate are formed in plural rows along the sides of the recording device substrate, and the flexible film wiring substrate has a plurality of electrode terminals formed at the positions counter to the electrodes on a reverse face of the flexible film wiring substrate, and the electrode terminals and the electrodes are respectively connected electrically and are fixed together by a thermosetting adhesive by hot-pressing.

9. The ink-jet recording head according to claim 1, wherein the thermosetting adhesive is an anisotropic electroconductive adhesive containing electroconductive particles, and electric connection is effected by the electroconductive particles.

10. An ink-jet recording apparatus employing the ink-jet recording head of claim 1, wherein the head is set on a carriage that reciprocates along a recording direction differing from a direction of recording medium conveyance to conduct recording on the recording medium.

11. An ink-jet recording head comprising a recording device substrate for discharging a recording liquid by pressure of bubble formation caused by thermal energy, a flexible film wiring substrate fitted to the recording device substrate, an electrode pad for receiving control signals from outside for controlling thermal energy generation in the recording device substrate, and a wiring substrate connected electrically to the recording device substrate with interposition of the flexible film wiring substrate, wherein an input terminal of the flexible film wiring substrate and an output terminal of the wiring substrate provided at a reverse face of the wiring substrate are electrically connected together and are fixed to each other by a thermosetting adhesive by hot-pressing, and a portion of that connected portion is coated with the thermosetting adhesive, wherein the recording device substrate is held on a liquid supplying-holding member for supplying a recording liquid to the substrate, and the wiring substrate is held on a face adjacent to the recording device substrate-holding face of the liquid supplying holding member, and wherein the input terminal of the flexible film wiring substrate is fixed between the output terminal provided at a reverse face of the wiring substrate and the liquid supplying-holding member.

12. The ink-jet recording head according to claim 11, wherein an electrode terminal of the flexible film wiring substrate and an electrode of the recording device substrate are electrically connected together and fixed to each other by the thermosetting adhesive by hot-pressing, and a portion of the electrode which is connected is coated with the thermosetting adhesive.

13. The ink-jet recording head according to claim 12, wherein the electrode of the recording device substrate is formed along an outer peripheral portion of the recording device substrate, the electrode terminal of the flexible film wiring substrate is formed at a position opposing the electrode on a reverse face of the flexible film wiring substrate, and the electrode terminal and the electrode are respectively connected electrically and are fixed together by a thermosetting adhesive by hot-pressing.

14. The ink-jet recording head according to claim 12, wherein the recording device substrate has a plurality of sides and a plurality of electrodes and the electrodes of the recording device substrate are formed in plural rows along the sides of the recording device substrate, and the flexible film wiring substrate has a plurality of electrode terminals formed at the positions counter to the electrodes on a reverse face of the flexible film wiring substrate, and the electrode terminals and the electrodes are respectively connected electrically and are fixed together by a thermosetting adhesive by hot-pressing.

15. The ink-jet recording head according to claim 12, wherein the portion of the connected electrode which is coated with the adhesive is lower in height than an orifice face of the recording device substrate having a plurality of discharge openings for discharging a liquid.

16. The ink-jet recording head according to claim 11, wherein the portion of that connected portion coated with the thermosetting adhesive is further sealed by a sealant.

17. The ink-jet recording head according to claim 16, wherein the thermosetting adhesive comprises an epoxy resin, and the sealant comprises a silicone resin.

18. The ink-jet recording head according to claim 16, wherein a protrusion of the thermosetting adhesive from an edge portion of the flexible film wiring substrate is limited.

19. The ink-jet recording head according to claim 18, wherein the protrusion of the thermosetting adhesive is not more than 0.5 mm.

20. The ink-jet recording head according to claim 11, wherein the thermosetting adhesive is an anisotropic electroconductive adhesive containing electroconductive particles, and electric connection is effected by the electroconductive particles.

21. An ink-jet recording apparatus employing the ink-jet recording head of claim 11, wherein the head is set on a carriage that reciprocates along a recording direction differing from a direction of recording medium conveyance to conduct recording on the recording medium.

22. An ink-jet recording head comprising a recording device substrate for discharging a recording liquid by pressure of bubble formation caused by thermal energy, a flexible film wiring substrate fitted to the recording device substrate, an electrode pad for receiving control signals from outside for controlling thermal energy generation in the recording device substrate, and a wiring substrate connected electrically to the recording device substrate with interposition of the flexible film wiring substrate, wherein an input terminal of the flexible film wiring substrate and an output terminal of the wiring substrate are electrically connected together and are fixed to each other by a thermosetting adhesive by hot-pressing, and a portion of that connected portion is coated with the thermosetting adhesive, wherein an electrode terminal of the flexible film wiring substrate and an electrode of the recording device substrate are electrically connected to each other and are fixed together by the thermosetting adhesive by hot-pressing, and at least part of that connected electrode is coated with the thermosetting adhesive, wherein the part of the connected electrode coated with the adhesive is lower in height than an orifice face of the recording device substrate having a plurality of discharge openings for discharging a liquid.

23. The ink-jet recording head according to claim 22, wherein the electrode of the recording device substrate is formed along an outer peripheral portion of the recording device substrate, the electrode terminal of the flexible film wiring substrate is formed at a position opposing the electrode on a reverse face of the flexible film wiring substrate, and the electrode terminal and the electrode are respectively connected electrically and are fixed together by a thermosetting adhesive by hot-pressing.

24. The ink-jet recording head according to claim 22, wherein the recording device substrate has a plurality of sides and a plurality of electrodes and the electrodes of the recording device substrate are formed in plural rows along the sides of the recording device substrate, and the flexible film wiring substrate has a plurality of electrode terminals formed at the positions counter to the electrodes on a reverse face of the flexible film wiring substrate, and the electrode terminals and the electrodes are respectively connected electrically and are fixed together by a thermosetting adhesive by hot-pressing.

25. The ink-jet recording head according to claim 22, wherein the portion of that connected portion coated with the thermosetting adhesive is further sealed by a sealant.

26. The ink-jet recording head according to claim 25, wherein the thermosetting adhesive comprises an epoxy resin, and the sealant comprises a silicone resin.

27. The ink-jet recording head according to claim 25, wherein a protrusion of the thermosetting adhesive from an edge portion of the flexible film wiring substrate is limited.

28. The ink-jet recording head according to claim 27, wherein the protrusion of the thermosetting adhesive is not more than 0.5 mm.

29. The ink-jet recording head according to claim 22, wherein the recording device substrate is held on a liquid supplying-holding member for supplying a recording liquid to the recording device substrate, and the wiring substrate is held on a face adjacent to a recording device substrate-holding face of the liquid supplying-holding member.

30. The ink-jet recording head according to claim 29, wherein the input terminal of the flexible film wiring substrate is fixed between the output terminal provided at a reverse face of the wiring substrate and the liquid supplying-holding member.

31. The ink-jet recording head according to claim 22, wherein the thermosetting adhesive is an anisotropic electroconductive adhesive containing electroconductive particles, and electric connection is effected by the electroconductive particles.

32. An ink-jet recording apparatus employing the ink-jet recording head of claim 22, wherein the head is set on a carriage that reciprocates along a recording direction differing from a direction of recording medium conveyance to conduct recording on the recording medium.

33. An ink-jet recording head comprising a recording device substrate for discharging a recording liquid by pressure of bubble formation caused by thermal energy, and a flexible film wiring substrate fitted to the recording device substrate, wherein an electrode terminal of the flexible film wiring substrate and an electrode of the recording device substrate are electrically connected together and fixed to each other by a thermosetting adhesive by hot-pressing, and a portion of the electrode which is connected is coated with the thermosetting adhesive, and wherein the electrode portion coated with the adhesive is lower in height than an orifice face of the recording device substrate having a plurality of discharge openings for discharging a liquid.

34. The ink-jet recording head according to claim 33, wherein the thermosetting adhesive is an anisotropic electroconductive adhesive containing electroconductive particles, and electric connection is effected by the electroconductive particles.

35. An ink-jet recording apparatus employing the ink-jet recording head of claim 33, wherein the head is set on a carriage that reciprocates along a recording direction differing from a direction of recording medium conveyance to conduct recording on the recording medium.

36. The ink-jet recording head according to claim 33, wherein the electrode of the recording device substrate is formed along an outer peripheral portion of the recording device substrate, the electrode terminal of the flexible film wiring substrate is formed at a position opposing the electrode on a reverse face of the flexible film wiring substrate, and the electrode terminal and the electrode are respectively connected electrically and are fixed together by a thermosetting adhesive by hot-pressing.

37. The ink-jet recording head according to claim 33, wherein the recording device substrate has a plurality of sides and a plurality of electrodes and the electrodes of the recording device substrate are formed in plural rows along the sides of the recording device substrate, and the flexible film wiring substrate has a plurality of electrode terminals formed at the positions counter to the electrodes on a reverse face of the flexible film wiring substrate, and the electrode terminals and the electrodes are respectively connected electrically and are fixed together by a thermosetting adhesive by hot-pressing.

\* \* \* \* \*

UNITED STATES PATENT AND TRADEMARK OFFICE
CERTIFICATE OF CORRECTION

PATENT NO. : 6,241,340 B1
DATED : June 5, 2001
INVENTOR(S) : Yasutomo Watanabe et al.

It is certified that error appears in the above-identified patent and that said Letters Patent is hereby corrected as shown below:

Title page,
Item [56], References Cited, U.S. PATENT DOCUMENTS insert:
-- 5,227,812 * 7/1993 Watanabe et al. .......347/50 --, and
-- 5,576,748 * 11/1996 Tamura .......347/58 --.
Item [57], ABSTRACT,
Line 2, "comprising" should read -- having --; and
Line 10, "substrate, wherein an" should read -- substrate. An --.

Column 1,
Line 8, "OA machines" should read -- office automation machines --;
Line 18, "mediums," should read -- media, --; and
Line 19, "recording is" should read -- recording method is --.

Column 2,
Line 22, "of" (second occurrence) should read -- by --;
Line 40, "the progress of" should read -- improvements in --; and "head" should read -- heads --;
Line 41, "in" should read -- for --; and
Line 59, "residue 211" should read -- residue 214 --.

Column 3,
Line 27, "makes difficult the increase of" should read -- makes it difficult to increase the --.

Column 4,
Line 7, "in" should read -- on --; and
Line 21, "is" should read -- are --.

Column 5,
Line 16, "opening" should read -- openings --;
Line 17, "which will be" should be deleted;
Line 27, "differently" should read -- in a manner different --; and "the conventional" should read -- the technique used for conventional --;
Line 28, "head," should read -- heads, --;
Line 30, "and fixed" should read -- and are fixed --;
Line 31, "by" should read -- employed in --;
Line 55, "or the" should read -- and --;
Line 56, "thereby" should read -- and so --; and
Line 57, "being" should read -- is --; and "differently" should read -- in any way different --.

UNITED STATES PATENT AND TRADEMARK OFFICE
CERTIFICATE OF CORRECTION

PATENT NO.    : 6,241,340 B1
DATED         : June 5, 2001
INVENTOR(S)   : Yasutomo Watanabe et al.

It is certified that error appears in the above-identified patent and that said Letters Patent is hereby corrected as shown below:

Column 7,
Line 33, "substrates are" should read -- substrates 4 are --;
Line 35, "film composed" should read -- film 9 composed --;
Line 61, "repelled to make unstable the" should read -- repelled, which makes --;
Line 62, "agent. Therefore," should read -- agent unpredictable. Therefore, --; and "preperably" should read -- preferably --;
Line 65, "stably" should be deleted; and
Line 66, "applied by" should read -- applied in a predictable manner by --.

Column 8,
Line 29, "constructing" should read -- forming --;
Line 37, "to uncover" should read -- exposing --; and
Line 40, "the substrate" should read -- the flexible film wiring substrate --.

Column 9,
Line 32, "4," should read -- 1, --;
Line 38, "causing neither" should read -- which prevents --;
Line 39, "nor" should read -- or --; and "the" should read -- a --; and
Line 51, "electrode 10" should read -- electrodes 10 --.

Column 10,
Line 32, "side-shootor" should read -- side-shooter --.

UNITED STATES PATENT AND TRADEMARK OFFICE
CERTIFICATE OF CORRECTION

PATENT NO. : 6,241,340 B1
DATED : June 5, 2001
INVENTOR(S) : Yasutomo Watanabe et al.

It is certified that error appears in the above-identified patent and that said Letters Patent is hereby corrected as shown below:

Column 11,
Line 26, "opening" should read -- openings --;
Lines 29 and 33, "opening," should read -- openings, --;
Line 39, "Therefore, deterioration" should read -- Therefore, it is possible to avoid the deterioration --; and "of" should read -- in --;
Line 40, "owing to" should read -- which might arise because of --; and "change" should read -- changes --; and "does not occur" should be deleted;
Line 41, "may" should read -- can --; and
Line 65, "or" should read -- and --.

Signed and Sealed this

Twenty-eighth Day of June, 2005

JON W. DUDAS
*Director of the United States Patent and Trademark Office*